(12) United States Patent
Hirano

(10) Patent No.: US 6,304,110 B1
(45) Date of Patent: *Oct. 16, 2001

(54) BUFFER USING DYNAMIC THRESHOLD-VOLTAGE MOS TRANSISTOR

(75) Inventor: Yuuichi Hirano, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,180

(22) Filed: Oct. 27, 1998

(30) Foreign Application Priority Data

Jun. 11, 1998 (JP) ................................. 10-163440

(51) Int. Cl.$^7$ ........................................................ H03B 1/00
(52) U.S. Cl. ............................ 327/108; 327/379; 327/534
(58) Field of Search ................................. 327/438, 419, 327/544, 534, 379, 380, 381, 389, 391, 108, 112, 22, 23, 24; 326/82, 83, 26, 27

(56) References Cited

U.S. PATENT DOCUMENTS

| | | | |
|---|---|---|---|
| 5,157,279 | * 10/1992 | Lee ........................................ | 326/86 |
| 5,422,591 | 6/1995 | Rastegar et al. ..................... | 327/409 |
| 5,537,067 | * 7/1996 | Carvajal et al. ..................... | 327/108 |
| 5,559,368 | * 9/1996 | Hu et al. .............................. | 327/328 |
| 5,565,795 | 10/1996 | Kawano ................................ | 326/81 |
| 5,644,266 | 7/1997 | Chen et al. .......................... | 327/534 |
| 5,748,016 | * 5/1998 | Kurosawa ............................ | 327/108 |
| 5,821,769 | * 10/1998 | Douseki .............................. | 327/534 |
| 5,883,540 | * 3/1999 | Kwon ................................... | 327/379 |

FOREIGN PATENT DOCUMENTS

| | | |
|---|---|---|
| 7-212210 | 8/1995 | (JP) . |
| 9-83338 | 3/1997 | (JP) . |

* cited by examiner

*Primary Examiner*—Terry D. Cunningham
*Assistant Examiner*—An T. Luu
(74) *Attorney, Agent, or Firm*—Oblon, Spivak, McClelland, Maier & Neustadt, P.C.

(57) ABSTRACT

A buffer using a dynamic threshold-value MOS transistor reduces its power consumption. Since transmitted to an output signal (S3) with some delay, transition of the input signal (S1) from low to high, for example, is also transmitted to a body of a transistor (N1) for a while. This increases the body potential to reduce the threshold value, thereby shortening time required to turn on the transistor (N1). After that, the output signal (S1) becomes completely high to turn off a transistor (P2), which stops the transmission of the input signal (S1) to the body of the transistor (N1). At the same time, a transistor (N2) is turned on, so that the body potential of the transistor (N1) is grounded to be completely low. Thus, the threshold voltage is increased again. This prevents a current flow from body to source in the transistor (N1), thereby reducing power consumption.

9 Claims, 6 Drawing Sheets

PRIOR ART  FIG. 8

PRIOR ART *FIG. 9*
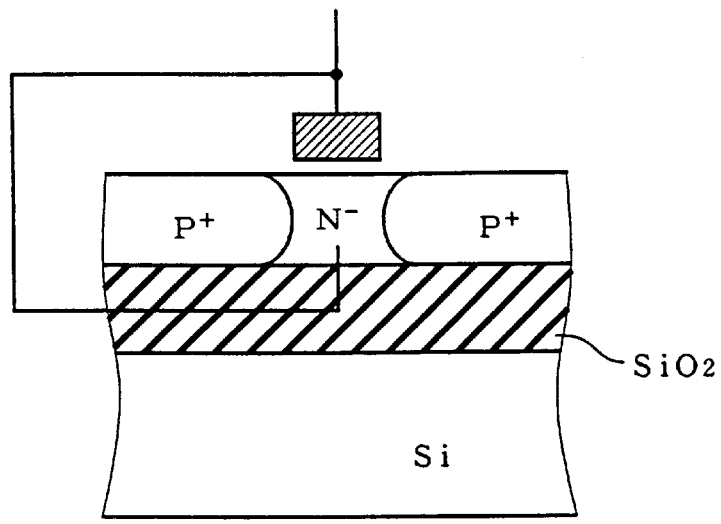
PRIOR ART *FIG. 10*
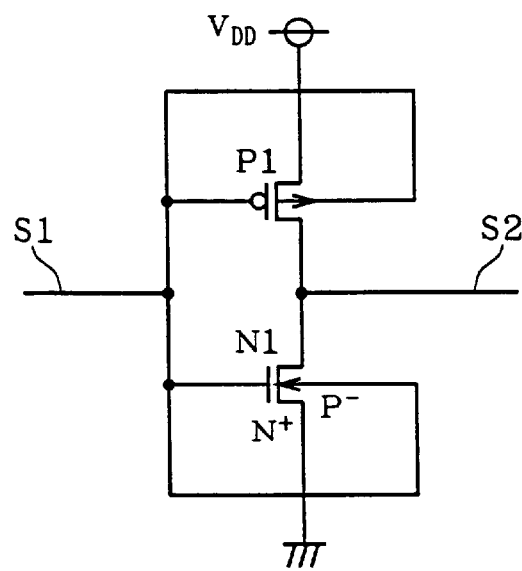

BACKGROUND ART  F I G . 1 1
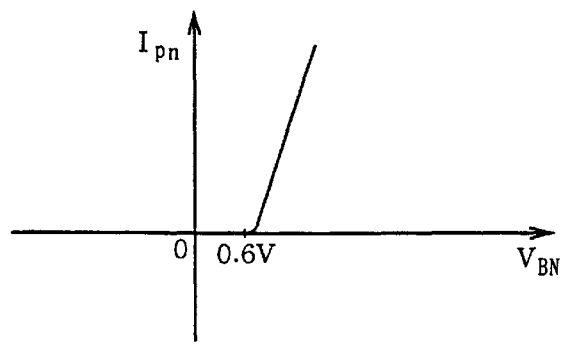
BACKGROUND ART  F I G . 1 2
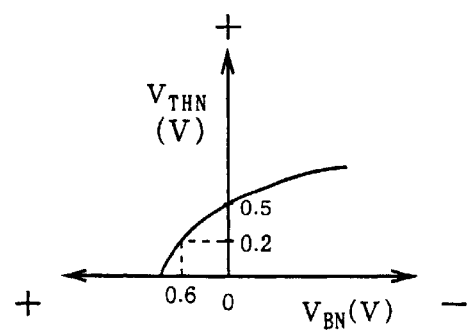
BACKGROUND ART  F I G . 1 3
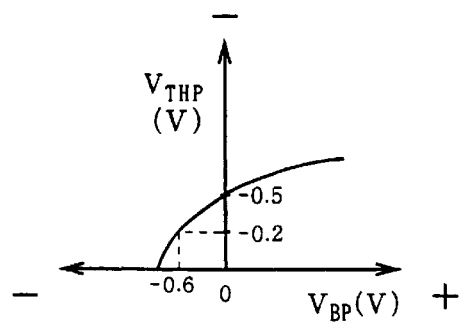

BUFFER USING DYNAMIC THRESHOLD-VOLTAGE MOS TRANSISTOR

BACKGROUND OF THE INVENTION

1. Field of the Invention

The present invention relates to a buffer using a dynamic threshold-voltage MOS transistor to improve operating speed of an MOS transistor.

2. Background of the Invention

A dynamic threshold-voltage MOS (DTMOS) transistor is a device that improves the structure of an MOS transistor to obtain high-speed performance. A characteristic of this transistor is that an input signal to the gate is applied also to the body in the SOI structure (or the back-gate in the bulk structure). FIGS. 8 and 9 show the structures of an NMOS transistor and a PMOS transistor, respectively, both having the SOI structure. In FIG. 8, the body is a $P^-$ region, while an $N^-$ region in FIG. 9. We will give the following description, laying stress on the SOI structure. FIG. 12 shows the relation between a body potential and a threshold voltage of the NMOS transistor, and FIG. 13 shows like relation of the PMOS transistor. The relations are common both in the SOI and the bulk structures. The relation between the body potential and the threshold voltage in the SOI structure has been introduced, for example, by Jeane Pierre Colinge, "Silicon on Insulator Technology Material to VLSI," Kluwer Academic Publishers, 1991, p. 118, while the relation in the bulk structure has been introduced, for example, by H. Yanai and M. Nagata, "Integrated Electronics (1)," CORONA PUBLISHING CO., LTD., 1987, p. 69. In the NMOS transistor, as the applied voltage to the body is increased in the positive direction, the threshold voltage is reduced to zero. In the PMOS transistor, on the contrary, as the applied voltage to the body is increased in the negative direction, the threshold voltage is increased in the positive direction to zero.

As an example of using such a DTMOS transistor, a CMOS buffer is shown in FIG. 10. First, considering the operation of an NMOS transistor N1 in FIG. 10, when the input signal makes a transition from low to high, the body potential also makes a transition from low to high, and the threshold voltage of the NMOS transistor N1 approaches zero as shown in the graph of FIG. 12. This increases speed in turning on the NMOS transistor N1, thereby improving discharge capability of the CMOS buffer. Next, as for the operation of a PMOS transistor P1 in FIG. 10, when the input signal makes a transition from high to low, the body potential also makes a transition from high to low, and the threshold voltage of the PMOS transistor P1 approaches zero as shown in the graph of FIG. 13. This increases speed in turning on the PMOS transistor P1, thereby improving charging capability of the CMOS buffer.

In the DTMOS transistor, however, the trade-off for high-speed performance is increased power consumption. For example, in the NMOS transistor, since the body potential is high when the input signal is high, the body $P^-$ and the source $N^+$ form a forward-bias pn junction. As is well-known, the voltage-current characteristics of the pn junction is as shown in FIG. 11, where $I_{pn}$ is current flowing from body to source of the NMOS transistor and $V_{BN}$ is the body potential, and the rising voltage is approximately 0.6 V. Since a high-level signal is generally not less than 0.6V, current will continuously flow from body to source during the high state of the input signal, which increase power consumption. This goes for the PMOS transistor. That is, since the source $P^+$ and the body $N^-$ of high potential form a forward-bias pn junction when the input signal is low, current will continuously flow from source via body to the input during the low state of the input signal.

Thus, an object of the present invention is to reduce a constant flow of current to the body while keeping high-speed performance in the DTMOS transistor. For the NMOS transistor, this can be accomplished by increasing the applied voltage to the body to reduce the threshold value only when the signal makes a transition, while after the completion of the transition, reducing the applied voltage to increase the threshold value. That goes for the PMOS transistor except that the direction of the voltage is reversed.

Although not having such an object, some prior arts may have a potential of giving an effect on the aforementioned issues. One example is the technique disclosed in Japanese Patent Laid-Open No. 9-83338, for suppressing fluctuations of ground potential due to discharge current occurring when the NMOS transistor is turned on, in the buffer circuit of the CMOS structure. According to this technique, the NMOS transistor is connected at its output end to the source of another PMOS transistor not in the CMOS structure, and the PMOS transistor is connected at its drain to the body of the NMOS transistor (connected always to a constant voltage source) and receives pulses at its gate only when the input signal to the gate of the CMOS buffer makes a transition. Such a structure prevents fluctuations of the ground potential, because within a short initial period when the input signal starts a transition, the PMOS transistor is turned on to apply current to the body of the NMOS transistor in the CMOS structure, while at other times, the current flowing in the NMOS transistor is prevented. In this structure, it is possible to temporarily increase the body potential of the NMOS transistor when the input signal makes a transition from low to high, depending on other settings for a voltage source connected constantly to the body, and so on. Thus, the effect of the present invention may be obtained.

Another example is the technique for improving operating speed, disclosed in T. W. Houston, "A Novel Dynamic Vt Circuit Configuration," Proceedings 1997 IEEE International SOI Conference, Oct. 1997, pp.154–155. As in Japanese Patent Laid-Open No. 9-83338, according to this technique, the NMOS transistor is connected at its output end to the source of another PMOS transistor out of the CMOS structure, and the PMOS transistor is connected at its drain to the body of the NMOS transistor. The PMOS transistor, however, receives at its gate an input signal to an ante-stage inverter of the CMOS buffer. In such a structure, the PMOS transistor is turned on before the input signal to the CMOS buffer makes a transition from low to high, so that the high-level output of the CMOS buffer is propagated to the body of the NMOS transistor, reducing the threshold value. This shortens the transition time, thereby achieving high-speed performance. The output of the CMOS buffer remains low until the next transition, so that the PMOS transistor not in the CMOS structure is maintained in the on state. This keeps the body potential of the NMOS transistor low, preventing the current flow from the body to the source, to thereby suppress power consumption. As is the case with the NMOS transistor, the PMOS transistor in the CMOS structure is, in a similar fashion, connected to another NMOS transistor not in the CMOS structure. Thus, the same as described above can be said of the PMOS transistor.

The former example, however, has an disadvantage of increasing a circuit scale, because an inverter and an AND circuit are required to produce pulses at the transition of the input signal.

The latter example also has an disadvantage. When the input signal to the CMOS buffer makes a transition from low to high later on, the body potential of the NMOS transistor in the CMOS buffer floats since the PMOS transistor out of the CMOS structure is off. The floating potential increased by noise makes the threshold voltage reduced. This may turn on the NMOS transistor which has to be turned off, and thereby the circuit ends up in error. The same can be said of the PMOS transistor.

SUMMARY OF THE INVENTION

A first aspect of the present invention is directed to a buffer using a dynamic threshold-voltage MOS transistor. The buffer comprises: an input terminal receiving an input signal that makes a transition from a first potential corresponding to a first logic to a second potential corresponding to a second logic; an output terminal; a first transistor having a gate electrode connected to the input terminal, a first current electrode given a third potential corresponding to the first logic, a second current electrode connected to the output terminal, and a body electrode, being conductive when applied to the gate electrode is a potential far from the third potential toward the second potential by the absolute value of a first threshold value; and a transmission circuit transmitting the input signal to the body electrode of the first transistor when a potential at the second current electrode of the first transistor corresponds to the second logic.

Preferably, according to a second aspect of the present invention, in the buffer of the first aspect, the transmission circuit comprises: an inverter having an input end connected to the second current electrode of the first transistor, and an output end; and a second transistor of an opposite conductivity type to the first transistor, having a gate electrode connected to the output end of the inverter, a first current electrode connected to the input terminal, and a second current electrode connected to the body electrode of the first transistor.

Preferably, according to a third aspect of the present invention, the buffer of the second aspect further comprises: a third transistor of the same conductivity type as the first transistor, having a gate electrode connected to the gate electrode of the second transistor, a first current electrode connected to a fourth potential corresponding to the first logic, and a second current electrode connected to the body electrode of the first transistor.

Preferably, according to a fourth aspect of the present invention, in the buffer of the first aspect, the input signal further makes a transition from the second potential to the first potential. The buffer further comprises: a second transistor having a gate electrode connected to the input terminal, a first current electrode given a fourth potential corresponding to the second logic, a second current electrode connected to the output terminal, and a body electrode, being conductive when applied to the gate electrode is a potential far from the fourth potential toward the first potential by the absolute value of a second threshold value; and a second transmission circuit transmitting the input signal to the body electrode of the second transistor when a potential at the second current electrode of the second transistor corresponds to the first logic.

Preferably, according to a fifth aspect of the present invention, in the buffer of the first aspect, the absolute value of a potential difference between the body electrode and the first current electrode of the first transistor does not exceed a diffusion potential at a pn junction between the body electrode and the first current electrode.

In the buffer according to the first aspect, when the transmission circuit is in the conducting state, the body potential of the first transistor is almost equal to the potential of the input signal. Thus, a potential change of the input signal causes a corresponding change in the body potential. The larger is the absolute value of the potential difference between the body potential and the third potential, the smaller is the first threshold value as compared with the case where the body potential corresponds to the first potential. This facilitates conduction of the first transistor when the input signal makes a transition from the first potential to the second potential.

In the buffer according to the second aspect, when corresponding to the first logic, the output of the inverter brings the second transistor into conduction. This allows the body potential of the first transistor to be almost equal to the potential of the input circuit, thereby achieving the effect of the first aspect.

In the buffer according to the third aspect, when the input signal makes a transition to the second potential, the output of the inverter corresponds to the second logic and brings the third transistor into conduction while bringing the second transistor out of conduction. Thus, the body potential of the first transistor becomes almost equal to the fourth potential. This limits the current flow from the body electrode to the first current electrode of the first transistor only within a short initial period when the input signal starts a transition, thereby reducing power consumption. Further, the first threshold value is increased since the body potential of the first transistor is almost equal to the fourth potential, it becomes possible to suppress malfunction due to noise when the input signal is at the second potential.

In the buffer according to the fourth aspect, when the transmission circuit is in the conducting state, the body potential of the second transistor is almost equal to the potential of the input signal. Thus, a potential change of the input signal causes a corresponding change in the body potential. The larger is the absolute value of the potential difference between the body potential and the fourth potential, the smaller is the second threshold value as compared with the case where the body potential corresponds to the second potential. This facilitates conduction of the second transistor when the input signal makes a transition from the second potential to the first potential.

In the buffer according to the fifth aspect, it is possible to limit the current flow from the body electrode to the first current electrode of the first transistor, caused by the forward-bias pn junction between the body electrode and the first current electrode. This suppresses power consumption to a minimum.

Thus, an object of the present invention is to reduce a constant current flow to the body while maintaining high-speed performance in the DTMOS transistor, and further to overcome the conventional problems.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 8 and 9 show the structure of an element according to a conventional technique.

FIG. 10 is a circuit diagram according to the conventional technique.

FIGS. 11 to 13 show operating characteristics of the conventional technique.

DESCRIPTION OF THE PREFERRED EMBODIMENTS

1. First Preferred Embodiment

Figure 1:
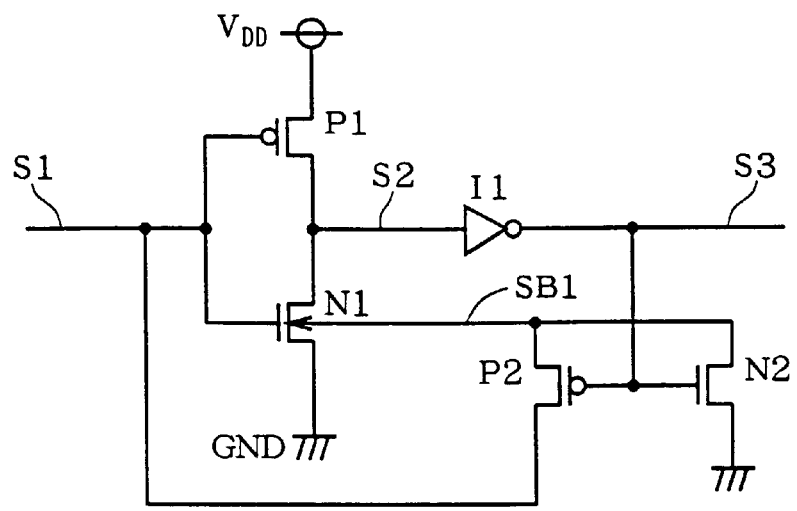
FIG. 1 is a circuit diagram according to a first preferred embodiment of the present invention.

FIG. 1 shows an example of a circuit with an DTMOS transistor according to the present invention applied to a CMOS buffer as an NMOS transistor. The CMOS buffer is composed of a PMOS transistor P1 and an NMOS transistor N1. A source potential $V_{DD}$ is applied to the source of the PMOS transistor P1, while a ground potential GND is applied to the source of the NMOS transistor N1. An input signal S1 is applied to the source of a PMOS transistor P2 as well as both gates of the PMOS transistor P1 and the NMOS transistor N1. The PMOS transistor P1 and the NMOS transistor N1 are connected at their drain, in common, to the input end of an inverter I1. The PMOS transistor P2 and an NMOS transistor N2 receives at their gates, in common, an output signal S3 from the post-stage inverter I1 of the CMOS buffer. Further, the PMOS transistor P2 and the NMOS transistor N2 are connected at their drains, in common, to the body of the NMOS transistor N1. The NMOS transistor N2 is grounded at its source.

Figure 2:
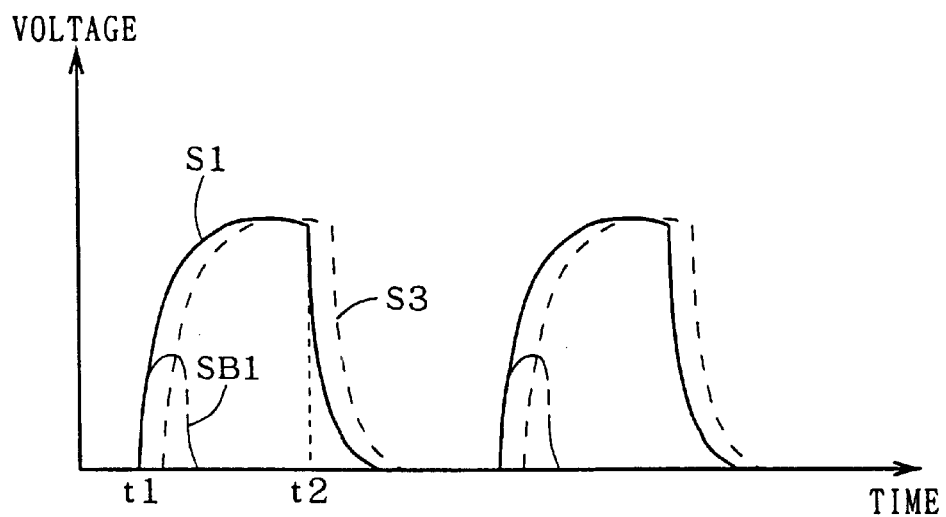
FIG. 2 is a timing chart of the operation according to the first preferred embodiment.

The operation of such a circuit is shown in FIG. 2. As an example, consider the operation of each device around at time t1 when the input signal S1 starts a transition from low to high. At the time t1, the output signal S3 of the inverter I1 is still at a low level, so that the PMOS transistor P2 is on. Further, a signal SB1 applied to the body of the NMOS transistor N1 is low in level, since its logical value is equal to that of the input signal S1. Thus, the body of the NMOS transistor N1 is at a low potential. Since the applied voltage to the body is low, the threshold voltage $V_{THN}$ of the NMOS transistor N1 is high (cf. FIG. 12). After that, however, the signal SB1 to the body of the NMOS transistor N1 begins to rise with rising input signal S1. This causes the threshold voltage $V_{THN}$ of the NMOS transistor N1 to fall. Since the NMOS transistor N1 is turned on at the point where the rising input signal S1 agree with the falling threshold voltage $V_{THN}$, the application of the voltage to the body of the NMOS transistor N1 improves speed in turning on the NMOS transistor N1. Then, the transition of the input signal S1 is propagated to the inverter I1, and thus to the output signal S3. As the output signal S3 rises, the gate potential of the PMOS transistor P2 makes a transition from low to high. Thus, the PMOS transistor P2 is turned off during the transition of the output signal S3. Instead of this, the NMOS transistor N2 is turned on, so that the signal SB1 to the body of the NMOS transistor N1 changes from the input signal S1 to the ground potential GND. This increases the threshold voltage $V_{THN}$ of the NMOS transistor N1 again, with reference to FIG. 12, thereby preventing the ground potential GND varied due to noise from exceeding the threshold voltage to turn off the NMOS transistor N1. That is, the NMOS transistor N1 is maintained in the on state.

Next, consider the operation at time t2 when the input signal S1 starts a transition from high to low, after potential stabilization of the output signal S3. Since the output signal S3 is still high at the time t2, the body of the NMOS transistor N1 is grounded via the NMOS transistor N2. Thus, the threshold voltage $V_{THN}$ of the NMOS transistor N1 is high. After that, when the input signal S1 falls to be smaller than the threshold voltage $V_{THN}$, the NMOS transistor N1 is turned off. After that, the output signal S3 begins to fall, by which the PMOS transistor P2 is turned on instead of the NMOS transistor N2. This transmits the input signal S1 again to the body of the NMOS transistor N1. At this time, however, since the input signal S1 is halfway through its transition from high to low, the voltage applied to the body of the NMOS transistor N1 is not high enough with reference to the source potential. Thus, the threshold voltage $V_{THN}$ of the NMOS transistor N1 is not so reduced. This makes it difficult to prevent the transition of the NMOS transistor N1 to its off state. Further, since the body potential of the NMOS transistor N1 remains low until the next transition, the absolute value of the threshold voltage is maintained high, which keeps the NMOS transistor N1 certainly in the off state. That is, the input signal S2 of the inverter I2 does not become low because of the off-state NMOS transistor N1, but becomes high by conduction of the PMOS transistor P1. This permits proper operation of the CMOS buffer.

The rest of the operation goes in a similar fashion. That is, the threshold voltage of the DTMOS transistor is reduced by maintaining high body voltage only during a slight initial period when the input signal makes a transition from low to high, while it is increased at other times. This reduces current flowing from body to source while maintaining high-speed performance in the DTMOS transistor, thereby reducing power consumption.

Further, the output signal S3 of the post-stage inverter I1 of the CMOS buffer is used as the signal to the PMOS transistor P2. If a CMOS inverter is adopted as this inverter I1, the DTMOS transistor requires only two additional devices. This avoids an increase in circuit scale.

The existence of the NMOS transistor N2 further allows the body to be certainly maintained at a low potential except during the transition of the input signal S1. This prevents malfunction of the NMOS transistor N1 due to noise.

Since provided only to transmit a voltage signal not to drive a heavy load, the sizes of the PMOS transistor P2 and the NMOS transistor N2 are large enough when they are about 1/10 to 1/100 in the sizes of the NMOS transistor N1 and the PMOS transistor P1 in the CMOS buffer. This avoids an increase in chip area.

It is general to use the SOI structure for the DTMOS transistor because of its small parasitic capacitance, less leak current, and low power source. The present invention, on the other hand, employs only its effect of varying the threshold value by the application of voltage to the body, called a substrate bias effect. This effect can also be obtained in the bulk structure, so that the circuit according to the present invention can be accomplished by the bulk structure.

Further, only if the size of the PMOS transistor P2 is adjusted in such a manner that the voltage applied to the body of the NMOS transistor N1 is within the range of 0 to +0.6 V with reference to the source potential, power consumption can be suppressed to a minimum. This is because, since the threshold voltage at which the current at the pn junction flows is about 0.6 V as shown in FIG. 11, little current flows when the applied voltage is within this range.

2. Second Preferred Embodiment

Figure 3:
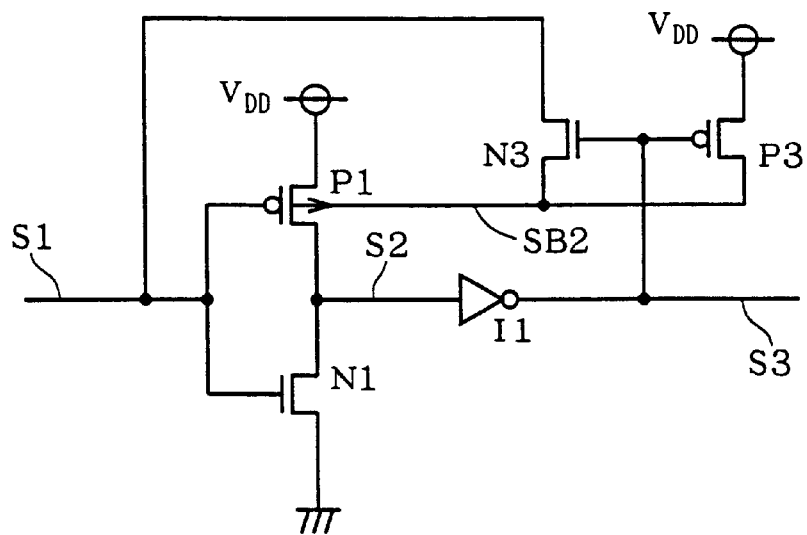
FIG. 3 is a circuit diagram according to a second preferred embodiment of the present invention.

FIG. 3 shows an example of a circuit with the DTMOS transistor according to the present invention applied to the CMOS buffer as a PMOS transistor. The structure is symmetrical to that of the first preferred embodiment. First, the CMOS buffer composed of the PMOS transistor P1 and the NMOS transistor N1 is similar in structure to that of the first preferred embodiment. The input signal S1 is applied to the source of an NMOS transistor N3 as well as to both gates of the PMOS transistor P1 and the NMOS transistor N1. As is the case with the first preferred embodiment, the PMOS transistor P1 and the NMOS transistor N1 are connected at their drains, in common, to the input end of the inverter I1. The NMOS transistor N3 and the PMOS transistor P3 receives the output signal S3 from the inverter I1 at their gates, in common. Further, the NMOS transistor N3 and the PMOS transistor P3 are connected at their drains, in common, to the body of the PMOS transistor P1. Further, the source potential $V_{DD}$ is applied to the source of the PMOS transistor P3.

Figure 4:
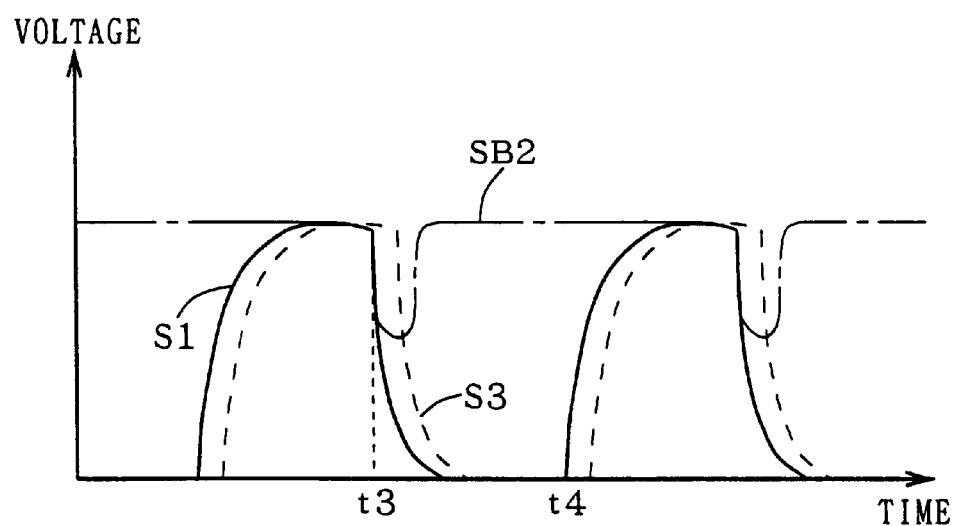
FIG. 4 is a timing chart of the operation according to the second preferred embodiment.

The operation of such a circuit is shown in FIG. 4, which is symmetrical to that of the first preferred embodiment. First, as an example, consider the operation of each device around at time t3 when the input signal S1 makes a transition from high to low. At the time t3, the output signal S3 of the inverter I1 is still high, so that the NMOS transistor N3 is on. Further, a signal SB2 applied to the body of the PMOS transistor P1 is high in level, since its logical value is equal to that of the input signal S1. Thus, the body of the PMOS transistor P1 is at a high potential. Since the applied voltage to the body is high, the threshold value $V_{THP}$ of the PMOS transistor P1 is low (high in the negative direction, c.f. FIG. 13). After that, however, the signal SB2 to the body of the PMOS transistor P1 begins to fall with falling input signal S1. This causes the threshold voltage $V_{THP}$ of the PMOS transistor P1 to rise in the positive direction. Since the PMOS transistor P1 is turned on at the point where the falling input signal S1 agree with the rising threshold value $V_{THP}$, the application of the voltage to the body of the PMOS transistor P1 improves speed in turning on the PMOS transistor P1. Then, the transition of the input signal S1 is propagated to the inverter I1, and thus to the output signal S3. As the output signal S3 falls, the gate potential of the NMOS transistor N3 makes a transition from high to low. Thus, the NMOS transistor N3 is turned off during the transition of the output signal S3. Instead of this, the PMOS transistor P3 is turned on, so that the signal SB2 to the body of the PMOS transistor P1 is changed from the input signal S1 to the source potential $V_{DD}$. This reduces the threshold value $V_{THP}$ of the PMOS transistor P1 again (increase in the negative direction), with reference to FIG. 13, thereby preventing the source potential $V_{DD}$ varied due to noise from falling below the threshold voltage to turn off the PMOS transistor P1. That is, the PMOS transistor P1 is maintained in the on state.

Next, consider the operation at time t4 when the input signal S1 starts a transition from low to high, after potential stabilization of the output signal S3. Since the output signal S3 is still low at the time t4, the body of the PMOS transistor P1 is connected to the source potential $V_{DD}$ via the PMOS transistor P3. Thus, the threshold voltage $V_{THP}$ of the PMOS transistor P1 is low. After that, when the input signal S1 rises to be larger than a potential lower than the source potential $V_{DD}$ by the threshold voltage $V_{THP}$, the PMOS transistor P1 is turned off. After that, the output signal S3 begins to rise, by which the NMOS transistor N3 is turned on instead of the PMOS transistor P3. This transmits the input signal S1 again to the body of the PMOS transistor P1. At this time, however, since the input signal S1 is halfway through its transition from low to high, the voltage applied to the body of the PMOS transistor P1 is not low enough with reference to the source potential. Thus, the threshold voltage $V_{THP}$ of the PMOS transistor P1 is not so increased (the absolute value is not reduced to zero). This makes it difficult to prevent the transition of the PMOS transistor P1 to its off state. Further, since the body potential of the PMOS transistor P1 remains high until the next transition, the absolute value of the threshold voltage is maintained low (high in the negative direction), which keeps the PMOS transistor P1 certainly in the off state. That is, the input signal S2 of the inverter I2 does not become high because of the off-state PMOS transistor P1, but become low by conduction of the NMOS transistor N1. This permits proper operation of the CMOS buffer.

The rest of the operation goes in a similar fashion. That is, as in the first preferred embodiment, the threshold voltage of the DTMOS transistor is reduced nearly to zero by maintaining low body voltage only during a slight period of time that the input signal makes a transition from high to low, while it is increased in the negative direction at other times. This reduces current flowing from body to source while maintaining high-speed performance in the DTMOS transistor, thereby reducing power consumption.

Further, the output signal S3 of the post-stage inverter I1 of the CMOS buffer is used as the signal to the NMOS transistor N3. If a CMOS inverter is adopted as this inverter I1, the circuit scale is not increased as in the first preferred embodiment.

As in the first preferred embodiment, the existence of the PMOS transistor P3 further allows the body to be certainly maintained at a high potential except during the transition of the input signal S1. This prevents malfunction of the PMOS transistor P1 due to noise.

Further, as in the first preferred embodiment, since the sizes of the NMOS transistor N3 and the PMOS transistor P3 are large enough when they are about ⅒ to ¹⁄₁₀₀ in the sizes of the NMOS transistor N1 and the PMOS transistor P1. This avoids the problem of increased chip area.

Further, the circuit according to the present invention can be accomplished by the bulk structure, for the same reason as described in the first preferred embodiment.

Further, only if the size of the NMOS transistor N3 is adjusted in such a manner that the voltage applied to the body of the PMOS transistor P1 is within the range of 0 to −0.6 V with reference to the source potential, as in the first preferred embodiment, power consumption can be suppressed to a minimum.

3. Third Preferred Embodiment

Figure 5:
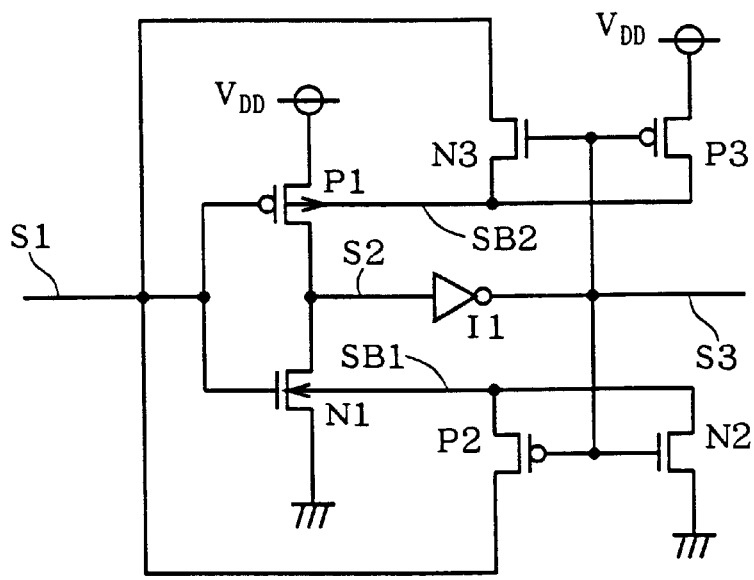
FIG. 5 is a circuit diagram according to a third preferred embodiment of the present invention.
Figure 6:
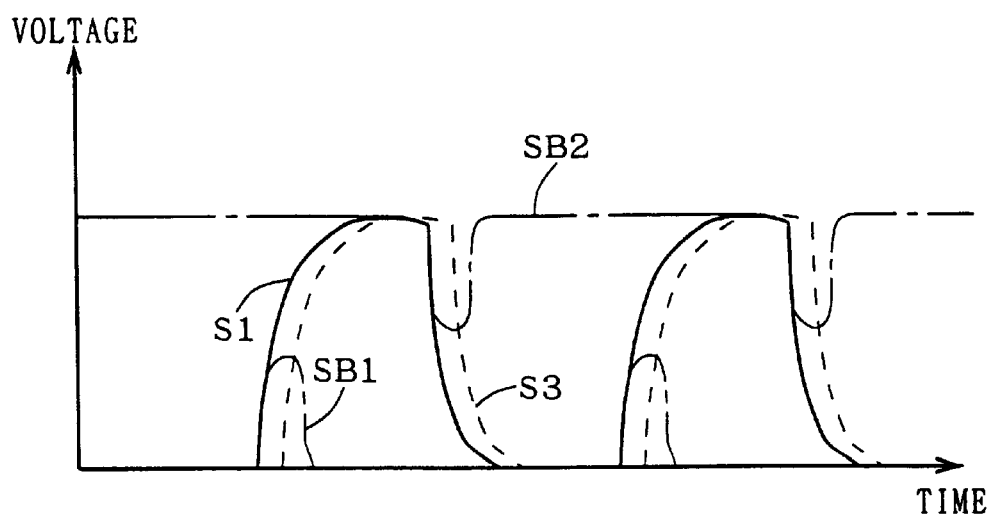
FIG. 6 is a timing chart of the operation according to the third preferred embodiment.

FIG. 5 shows a circuit wherein both the NMOS transistor and the PMOS transistor in the CMOS buffer are the DTMOS transistors according to the present invention. The circuit structure is a combination of the first and the second preferred embodiments. Further, as shown in FIG. 6, the operation thereof is also a combination of the first and the second preferred embodiments.

In such a structure, the threshold voltage of the DTMOS transistor is varied so that it is easily turned on, by varying the body voltage only during a slight period of time that the input signal makes a transition from low to high or from high to low. This further reduces current flowing from body to source, while maintaining its high-speed performance in the DTMOS transistor, as compared with the case where only a single DTMOS transistor are employed as described in the first and the second preferred embodiments. Thus, power consumption can be reduced.

This preferred embodiment further achieves the other effects of the first and the second preferred embodiments.

4. Fourth Preferred Embodiment

Figure 7:
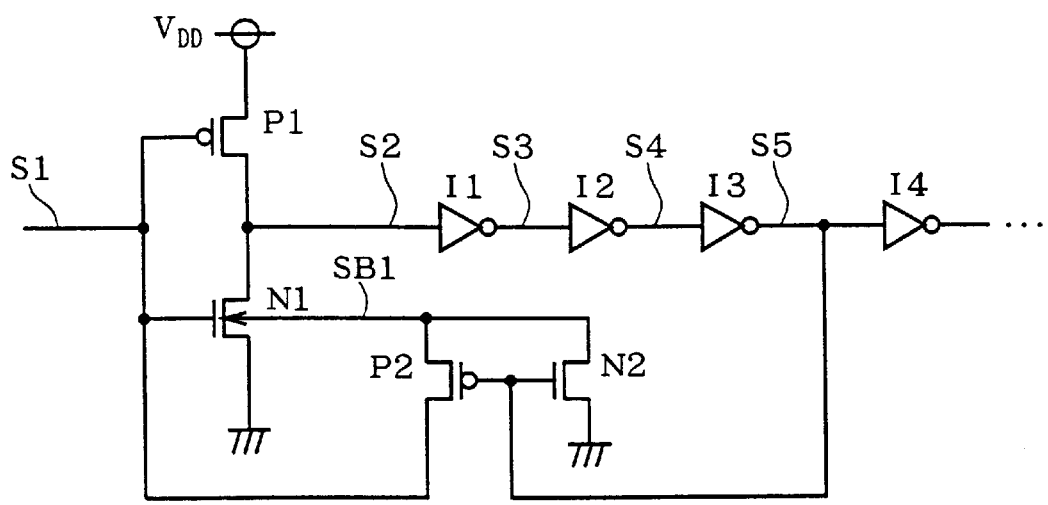
FIG. 7 is a circuit diagram according to a fourth preferred embodiment.
Figure 7:
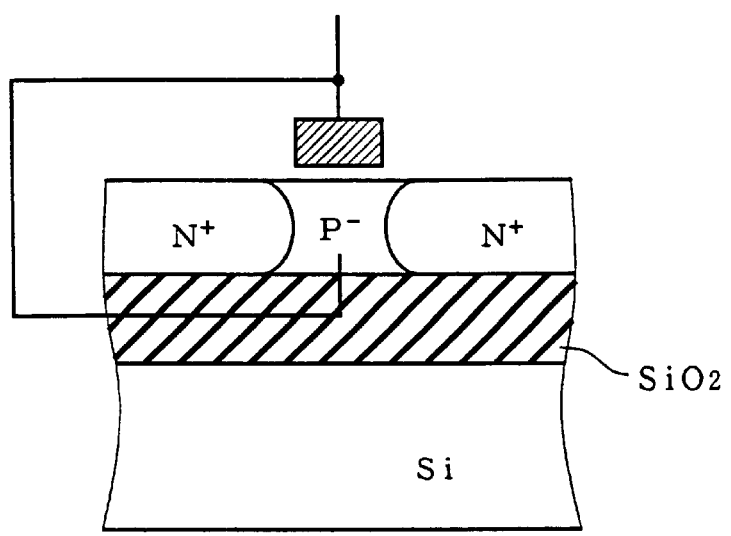

FIG. 7 shows a modification of the first preferred embodiment. While the signal applied to the gates of the PMOS transistor P2 and the NMOS transistor N2 is the output signal S3 of the inverter I1 connected directly to the CMOS buffer in the first preferred embodiment, the applied signal according to this preferred embodiment is for example an output signal S5 of an inverter I3 that is located three stages behind the CMOS buffer.

As is evident from the waveform of the output signal S3 in the graph of FIG. 2, the body voltage of the CMOS buffer can be controlled by any signal that is varied by the same logical value as the input signal to the CMOS buffer and that is applied with some delay. That is, any output of odd-numbered-stage inverters following the CMOS buffer can be applied to the gates of the PMOS transistor P2 and the NMOS transistor N2.

This preferred embodiment is efficient in that, when the CMOS buffer is followed by delay stages and so on composed of a series of inverters, wiring of the input signal can be arranged where easy connection is possible.

This method is, of course, applicable to the second and the third preferred embodiments.

While the invention has been described in detail, the foregoing description is in all aspects illustrative and not restrictive. It is understood that numerous other modifications and variations can be devised without departing from the scope of the invention.

What is claimed as new and desired to be secured by Letters Patents of the United States:

1. A buffer using a dynamic threshold-voltage MOS transistor, comprising:

an input terminal receiving an input signal that makes a transition from a first potential corresponding to a first logic to a second potential corresponding to a second logic;

an output terminal;

a first transistor having a gate electrode connected to said input terminal, a first current electrode given a third potential corresponding to said first logic, a second current electrode connected to said output terminal, and a body electrode, being conductive when applied to said gate electrode is a potential far from said third potential toward said second potential by the absolute value of a first threshold value; and a transmission circuit transmitting said input signal to said body electrode of said first transistor when a potential at said second current electrode of said first transistor corresponds to said second logic.

2. The buffer according to claim 1, wherein said first transistor further comprises a semiconductor substrate having a surface;

said first current electrode and said second current electrode formed in said surface;

said body electrode being a portion of said semiconductor substrate, sandwiched between said first current electrode and said second current electrode, said gate electrode opposed to said body electrode.

3. The buffer according to claim 2, wherein said first transistor further comprises an insulation layer formed adjacent to said first current electrode, said second current electrode, and said body electrode, opposed to said gate electrode.

4. The buffer according to claim 1, further comprising:

a second transistor of an opposite conductivity type to said first transistor, having a gate electrode connected to said input terminal, a first current electrode given a fourth potential corresponding to said second logic, and a second current electrode connected to said output terminal.

5. The buffer according to claim 1, wherein said transmission circuit comprises:

an inverter having an input end connected to said second current electrode of said first transistor, and an output end; and a second transistor of an opposite conductivity type to said first transistor, having a gate electrode connected to said output end of said inverter, a first current electrode connected to said input terminal, and a second current electrode connected to said body electrode of said first transistor.

6. The buffer according to claim 5, wherein said inverter includes an odd number of CMOS inverters connected in series.

7. The buffer according to claim 5, further comprising:

a third transistor of the same conductivity type as said first transistor, having a gate electrode connected to said gate electrode of said second transistor, a first current electrode given a fourth potential corresponding to said first logic, and a second current electrode connected to said body electrode of said first transistor.

8. The buffer according to claim 1, wherein said input signal further makes a transition from said second potential to said first potential, said buffer further comprising:

a second transistor having a gate electrode connected to said input terminal, a first current electrode given a fourth potential corresponding to said second logic, a second current electrode connected to said output terminal, and a body electrode, being conductive when applied to said gate electrode is a potential far from said fourth potential toward said first potential by the absolute value of a second threshold value; and a second transmission circuit transmitting said input signal to said body electrode of said second transistor when a potential at said second current electrode of said second transistor corresponds to said first logic.

9. The buffer according to claim 1, wherein the absolute value of a potential difference between said body electrode and said first current electrode of said first transistor does not exceed a diffusion potential at a pn junction between said body electrode and said first current electrode.

* * * * *